US 12,148,848 B2

(12) United States Patent
Kusukawa

(10) Patent No.: US 12,148,848 B2
(45) Date of Patent: Nov. 19, 2024

(54) PHOTOELECTRIC CONVERSION APPARATUS AND MANUFACTURING METHOD THEREFOR

(71) Applicant: CANON KABUSHIKI KAISHA, Tokyo (JP)

(72) Inventor: Masashi Kusukawa, Kanagawa (JP)

(73) Assignee: Canon Kabushiki Kaisha, Tokyo (JP)

( * ) Notice: Subject to any disclaimer, the term of this patent is extended or adjusted under 35 U.S.C. 154(b) by 379 days.

(21) Appl. No.: 17/218,377

(22) Filed: Mar. 31, 2021

(65) Prior Publication Data

US 2021/0313477 A1    Oct. 7, 2021

(30) Foreign Application Priority Data

Apr. 7, 2020 (JP) ................................. 2020-069146

(51) Int. Cl.
*H01L 27/146* (2006.01)
*H01L 31/0392* (2006.01)

(52) U.S. Cl.
CPC .. *H01L 31/03921* (2013.01); *H01L 27/14643* (2013.01); *H01L 27/14698* (2013.01)

(58) Field of Classification Search
CPC ......... H01L 31/03921; H01L 27/14643; H01L 27/14621; H01L 27/1463; H01L 27/14698; Y02E 10/50

See application file for complete search history.

(56) References Cited

U.S. PATENT DOCUMENTS

| | | |
|---|---|---|
| 8,941,198 B2 | 1/2015 | Enomoto |
| 9,337,226 B2 | 5/2016 | Manda et al. |
| 9,490,293 B2 | 11/2016 | Enomoto |
| 9,502,454 B2 | 11/2016 | Manda et al. |
| 9,576,996 B2 | 2/2017 | Enomoto |

(Continued)

FOREIGN PATENT DOCUMENTS

| | | |
|---|---|---|
| JP | 2010-73906 A | 4/2010 |
| JP | 2012-178457 A | 9/2012 |

(Continued)

OTHER PUBLICATIONS

Notice of Reasons for Refusal in Japanese Application No. 2020-069146 (Jan. 2024).

*Primary Examiner* — Meiya Li
(74) *Attorney, Agent, or Firm* — Venable LLP

(57) ABSTRACT

A photoelectric conversion apparatus includes a semiconductor substrate having a first surface and a second surface, a plurality of photoelectric conversion regions including an impurity of a first conductivity type and arranged at the semiconductor substrate, a trench arranged between the photoelectric conversion regions, an impurity region including an impurity of a second conductivity type opposite to the first conductivity type and arranged along a sidewall of the trench, and a first film arranged at the first surface of the semiconductor substrate and the sidewall of the trench. The impurity region includes a first region with an impurity concentration of a first concentration and a second region with an impurity concentration of a second concentration lower than the first concentration, and a distance between the first surface and the first region is smaller than a distance between the first surface and the second region.

12 Claims, 6 Drawing Sheets

(56) References Cited

U.S. PATENT DOCUMENTS

| | | |
|---|---|---|
| 9,577,002 B2 | 2/2017 | Enomoto |
| 9,871,071 B2 | 1/2018 | Enomoto |
| 9,893,105 B2 | 2/2018 | Manda et al. |
| 10,211,247 B2 | 2/2019 | Enomoto |
| 10,461,110 B2 | 10/2019 | Manda et al. |
| 10,622,396 B2 | 4/2020 | Enomoto |
| 10,693,023 B2 | 6/2020 | Shoyama et al. |
| 10,777,597 B2 | 9/2020 | Ogi et al. |
| 10,950,644 B2 | 3/2021 | Manda et al. |
| 11,088,191 B2 | 8/2021 | Ogawa |
| 11,398,514 B2 | 7/2022 | Iwabuchi et al. |
| 11,424,281 B2 | 8/2022 | Ogi et al. |
| 11,557,623 B2 | 1/2023 | Manda et al. |
| 11,824,075 B2 | 11/2023 | Ogawa |
| 11,862,652 B2 | 1/2024 | Manda et al. |
| 2005/0272233 A1 | 12/2005 | Lee et al. |
| 2009/0298273 A1* | 12/2009 | Lee .................. H10B 12/053 257/E21.409 |
| 2010/0066882 A1* | 3/2010 | Nagai ............... H01L 27/14609 348/311 |
| 2015/0115388 A1 | 4/2015 | Eda et al. |
| 2015/0243700 A1 | 8/2015 | Morooka |
| 2016/0284746 A1 | 9/2016 | Fukase et al. |
| 2017/0250255 A1* | 8/2017 | Siemieniec ............ H01L 29/407 |
| 2020/0091284 A1* | 3/2020 | Zundel ................ H01L 29/0847 |
| 2020/0274006 A1 | 8/2020 | Shoyama et al. |
| 2020/0365629 A1* | 11/2020 | Ogi ................... H01L 27/14623 |
| 2021/0005651 A1 | 1/2021 | Ohura |
| 2022/0344386 A1 | 10/2022 | Ogi et al. |
| 2022/0344388 A1* | 10/2022 | Ebiko ................ H01L 27/1463 |
| 2023/0411424 A1 | 12/2023 | Manda et al. |

FOREIGN PATENT DOCUMENTS

| | | |
|---|---|---|
| JP | 2015-70070 A | 4/2015 |
| JP | 2015-88568 A | 5/2015 |
| JP | 2015-162603 A | 9/2015 |
| JP | 2016-187007 A | 10/2016 |
| JP | 2019-140251 A | 8/2019 |
| JP | 2019-165136 A | 9/2019 |
| JP | 2019-176089 A | 10/2019 |
| JP | 2019-220703 A | 12/2019 |
| WO | 2018/174090 A | 9/2018 |

\* cited by examiner

PHOTOELECTRIC CONVERSION APPARATUS AND MANUFACTURING METHOD THEREFOR

CROSS-REFERENCE TO RELATED APPLICATION

This application claims the benefit of Japanese Patent Application No. 2020-069146, filed on Apr. 7, 2020, which is hereby incorporated by reference herein in its entirety.

BACKGROUND OF THE INVENTION

Field of the Invention

The present invention relates to a photoelectric conversion apparatus and a manufacturing method therefor.

Description of the Related Art

A solid-state image pickup apparatus (photoelectric conversion apparatus) has been widely used as an image pickup apparatus in a two dimensional image input apparatus such as a digital still camera or a video camcorder. In order to prevent color mixture between adjacent pixels in a solid-state image pickup apparatus including a plurality of pixels arrayed therein, a method is proposed, which forms, between pixels, element isolation of a trench having a high aspect ratio.

The element isolating trench is generally formed by RIE (Reactive Ion Etching), or the like. It is assumed that, upon the formation, dangling bonds are generated by damages by RI on the trench surface, and the resulting electric charges become a dark current.

In order to suppress the dark current, Japanese Patent Application Publication No. 2015-88568 discloses a solid-state image pickup apparatus including a P type impurity diffusion region so as to surround the trench outer circumference.

SUMMARY OF THE INVENTION

According to the first aspect of the present invention, it is provided a photoelectric conversion apparatus including a semiconductor substrate having a first surface and a second surface, a plurality of photoelectric conversion regions including an impurity of a first conductivity type and arranged at the semiconductor substrate, a trench arranged between the photoelectric conversion regions, an impurity region including an impurity of a second conductivity type opposite to the first conductivity type and arranged along a sidewall of the trench, and a first film arranged at the first surface of the semiconductor substrate and the sidewall of the trench, wherein the impurity region along the sidewall of the trench includes a first region with an impurity concentration of a first concentration and a second region with an impurity concentration of a second concentration lower than the first concentration, and a distance between the first surface and the first region is smaller than a distance between the first surface and the second region.

According to the second aspect of the present invention, it is provided a manufacturing method for a photoelectric conversion apparatus having a trench between photoelectric conversion regions, including a first etching step of forming a trench at a first surface of a semiconductor substrate including the first surface and a second surface, a first implanting step of doping a sidewall of the trench with an impurity of a second conductivity type after the first etching step, a second etching step of deepening a depth of the trench after the first implanting step, and a second implanting step of doping the sidewall of the trench with an impurity of a second conductivity type after the second etching step, wherein an impurity concentration in the first implanting step is greater than an impurity concentration in the second implanting step.

Further features of the present invention will become apparent from the following description of exemplary embodiments with reference to the attached drawings.

DESCRIPTION OF THE EMBODIMENTS

With the method of Japanese Patent Application Publication No. 2015-88568, the dark current may not be sufficiently suppressed. In the manufacturing step of a solid-state image pickup apparatus (photoelectric conversion apparatus), an insulation film embedding step and a heat treatment step after trench formation apply a stress on a semiconductor substrate around the trench. As a result, the suppression of the dark current becomes insufficient.

It is an object of the present invention to provide a photoelectric conversion apparatus capable of reducing the dark current from around the trench.

Below, the solid-state image pickup apparatus (photoelectric conversion apparatus) in accordance with the present invention will be described. Incidentally, below, an example in which the present invention is applied to a back side illumination type solid-state image pickup apparatus will be described. However, the application of the present invention is not limited thereto. The present embodiment can have the equal effect even when applied to the front side illumination type and the back side illumination type solid-state image pickup apparatus.

First Embodiment

Figure 1:
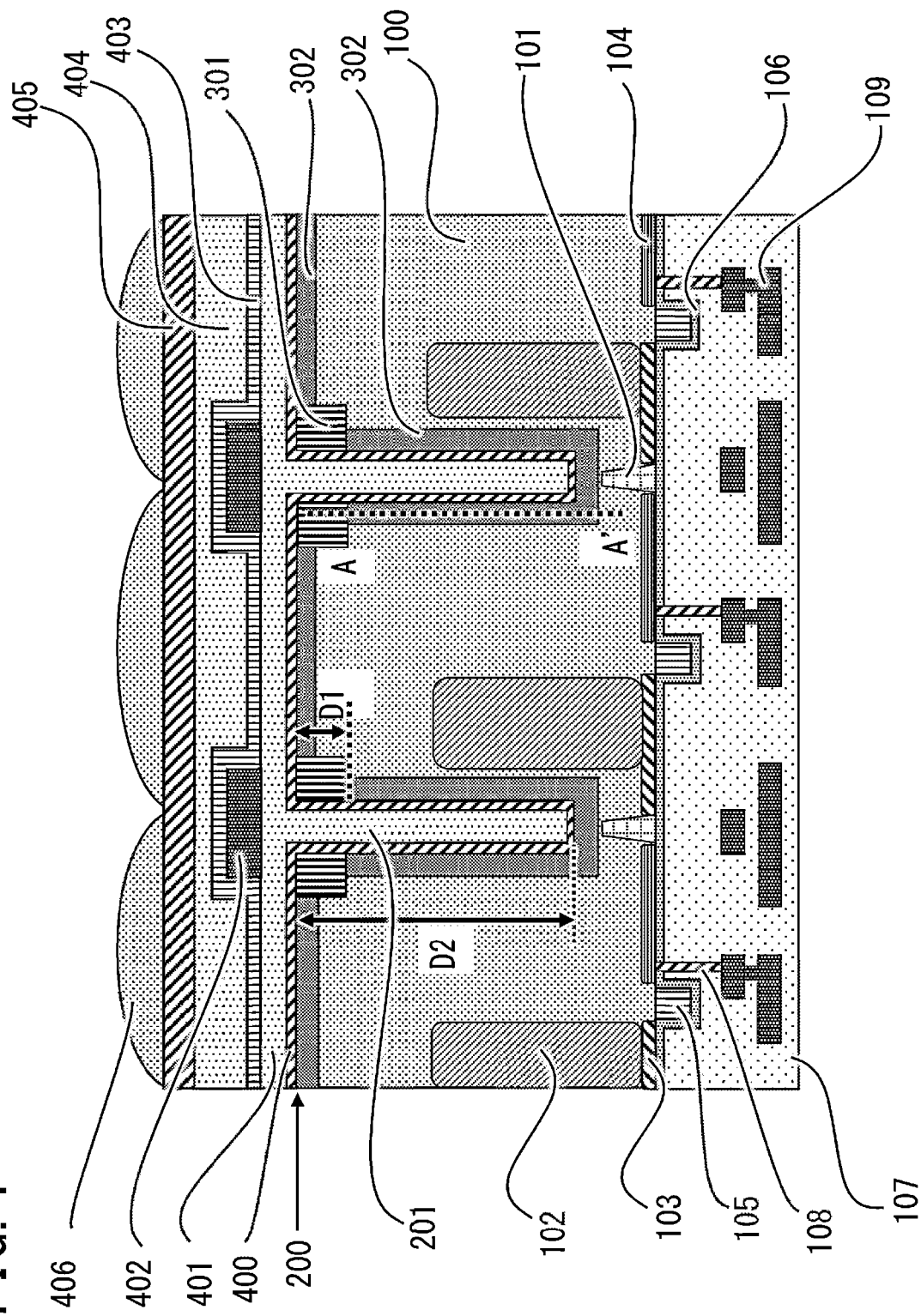
FIG. 1 is a cross sectional schematic view of a solid-state image pickup apparatus in accordance with First Embodiment.

FIG. 1 shows a cross sectional schematic view for illustrating a solid-state image pickup apparatus in accordance with First Embodiment of the present invention. A semiconductor substrate 100 is, for example, a single crystal silicon layer having a thickness of 1 to 10 μm, and preferably 2 to 5 μm. The semiconductor substrate 100 has a first surface and a second surface, and the first surface is a light receptive surface.

The semiconductor substrate 100 is provided with an element isolation region 101, a photoelectric conversion region 102, an impurity region 103, and a floating diffusion part 104. The element isolation region 101 is formed by shallow trench isolation (STI), a selective oxidation method (LOCOS), or the like. The photoelectric conversion region 102 is an impurity region doped with a first conductivity type (N type) impurity (e.g., phosphorus), and converts an incident light to an optical electric charge (electron). The impurity region 103 is a region doped with a second conductivity type (P type) impurity for allowing the photoelectric conversion region 102 to have an embedded structure. The floating diffusion part 104 is a first conductivity type (N type) impurity region. The semiconductor substrate 100 is provided with a pixel transistor including a gate electrode 105. An insulation film 106 including a silicon nitride film and an interlayer insulation film 107 including a silicon oxide film are formed so as to cover the gate electrode 105. The floating diffusion part 104 is connected to a wiring layer 109 via a contact plug 108.

In the present embodiment, the first conductivity type is assumed to be an N type, and the second conductivity type is assumed to be a P type. However, the first conductivity type and the second conductivity type may only have opposite polarities, and it is also acceptable that the first conductivity type is assumed to be a P type, and the second conductivity type is assumed to be an N type. In the latter case, the signal electric charge is a hole.

The semiconductor substrate 100 is provided with a trench 201 extending from a light receptive surface 200 toward another surface. The trench 201 is provided between the photoelectric conversion regions 102 for reducing color mixture between adjacent pixels. In the present embodiment, the width of the trench 201 is substantially constant entirely from the light receptive surface 200 to the trench bottom. The sidewall of the trench 201 and the light receptive surface 200 of the semiconductor substrate 100 are provided with second conductivity type (P type) impurity regions 301 and 302 formed by being doped with a second conductivity type (P type) impurity with a plasma doping method or a solid phase diffusion method. As the second conductivity type (P type) impurity, B: boron can be adopted. The second conductivity type (P type) impurity region 301 is the region with a prescribed size including the portion at which the sidewall of the trench 201 and the light receptive surface 200 intersect. The portion can also be referred to as a trench corner part. D1 is the depth from the light receptive surface 200 to the bottom of the second conductivity type (P type) impurity region 301, and D2 is the depth from the light receptive surface 200 to the bottom of the trench 201. At the depth D1, a width of the impurity region 302 is smaller than a width of the impurity region 301. The impurity region 301 is arranged between the trench 201 and a region. The region is a part of the impurity region 302, and extends along the light receptive surface 200. The region extends from the light receptive surface 200 to a depth that is smaller than the depth D1.

On the sidewall of the trench 201, and on the light receptive surface of the semiconductor substrate 100, a metal compound film 400 is provided. The metal compound film 400 is, for example, a lamination film of aluminum oxide ($Al_2O_3$) and tantalum oxide ($Ta_2O_5$) having a negative fixed electric charge. On the metal compound film 400, a silicon oxide film 401 and a metal film 402 as a light shielding film are provided. The silicon oxide film 401 is formed in the inside of the trench 201, and fills the trench, and the silicon oxide film 401 may be in a void shape. The metal film 402 is, for example, aluminum or tungsten. On the silicon oxide film 401 and the metal film 402, a passivation film 403, a planarizing film 404, a color filter layer 405, and a microlens 406 are provided.

Then, referring to FIGS. 2A and 2B, the second conductivity type (P type) impurity regions 301 and 302 formed on the sidewall of the trench 201 and the light receptive surface 200 of the semiconductor substrate 100 will be described in detail.

Figure 2A:
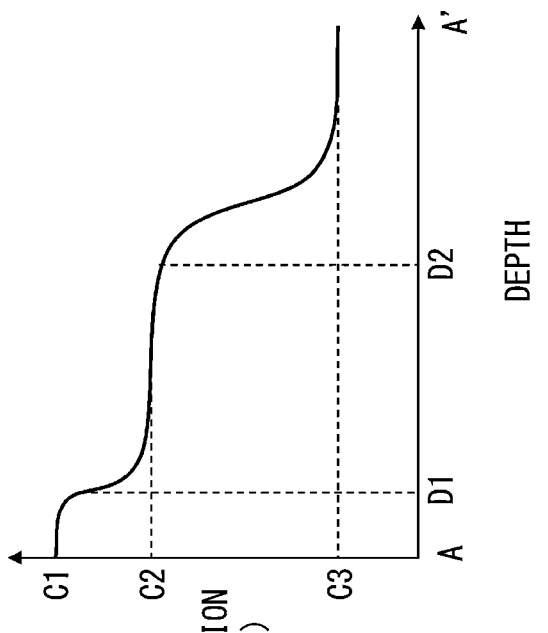
FIGS. 2A and 2B are each a view for illustrating the boron concentration profile by plasma doping.

FIG. 2A shows a profile of concentration (density) of boron (impurity) doped to a Si substrate by plasma doping or a solid phase diffusion method. The profile of concentration of boron doped to the Si substrate by plasma doping or a solid phase diffusion method has a feature that the boron concentration monotonously decreases from the Si surface toward the Si inside. Accordingly, the boron concentration profile from the Si surface toward the Si inside at the second conductivity type (P type) impurity regions 301 and 302 at the sidewall of the trench 201 and the light receptive surface 200 of the semiconductor substrate 100 has such a profile that the boron concentration monotonously decreases as in FIG. 2A. Further, the peak concentration B of the boron concentration by plasma doping or a solid phase diffusion method may fall within the range of, for example, $1.0 \times 10^{20}$ to $1.0 \times 10^{23}$ [atms/cm$^3$]. The peak concentration B of the boron concentration by plasma doping or a solid phase diffusion method be, for example, at least $1.0 \times 10^{21}$ [atms/cm$^3$]. The peak concentration B of the boron concentration by plasma doping or a solid phase diffusion method be, for example, not more than $1.0 \times 10^{22}$ [atms/cm$^3$].

Figure 2B:
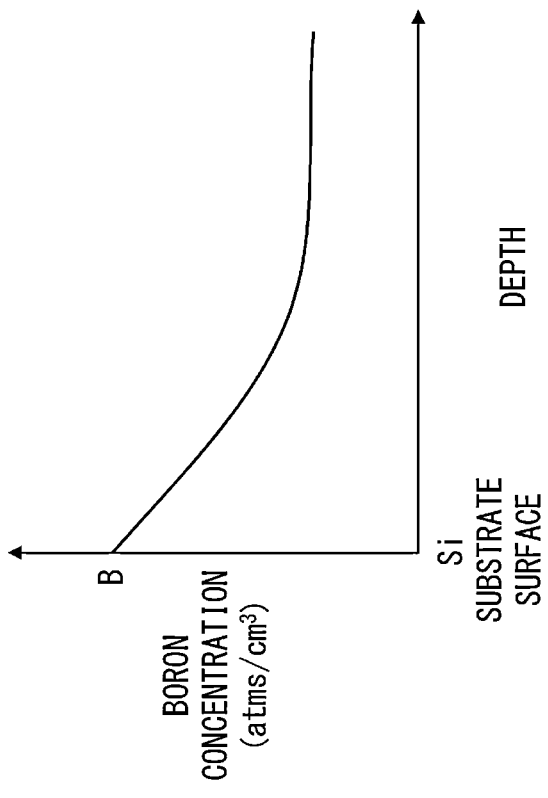

FIG. 2B shows a boron concentration profile A-A' along the depth direction of the sidewall of the trench 201. D1 is the depth from the light receptive surface 200 to the bottom of the second conductivity type (P type) impurity region 301, and D2 is the depth from the light receptive surface 200 to the bottom of the trench 201.

As shown in FIG. 2B, the profile of boron concentration of the impurity region along the sidewall of the trench 201 has a higher concentration than a prescribed concentration down to the depth D1, and has a lower concentration than the prescribed concentration at the deeper portion than the depth D1 with the boron concentration at the depth D1 as the prescribed concentration. The prescribed concentration is herein the boron concentration at the depth D1. The impurity region along the sidewall of the trench 201 includes a first region (301) having a boron concentration of C1 at from the light receptive surface 200 down to the depth D1, and a second region (302) having a boron concentration of C2 from at a depth of D1 down to a depth of D2. The boron concentration C1 is a higher value than the prescribed concentration, and C2 is a lower value than the prescribed concentration. The profile of boron concentration may only monotonously decrease (in a broad sense) with approach from the light receptive surface 200 in the depth direction of the trench other than that shown in FIG. 2B. However, the profile of boron concentration may partially increase along the depth direction. When the boron concentration C1 of the first region is higher than the boron concentration C2 of the second region, the concentrations of other regions may be arbitrary. Incidentally, the second conductivity type (P type) impurity region 302 is also formed on the light receptive surface 200, and the boron concentration along the light receptive surface 200 decreases with an increase in distance from the opening of the trench 201.

A depth region A-D1 in the vicinity of the opening of the trench 201 has a shape to which more stress is concentrated as compared with the trench sidewall part, and an insulation film embedding step and a heat treatment step after trench formation impose a stress, thereby causing defects. For this reason, in order to reduce or suppress the dark current, the boron concentration C1 of the second conductivity type impurity region 301 at the trench sidewall in the depth region A-D1 is desirably set larger than the boron concentration C2 of the second conductivity type impurity region 302 in the depth region D1-D2 of the trench sidewall and the light receptive surface 200. Further, the boron concentration C2 of the second conductivity type impurity region 302 in the depth region D1-D2 at the trench sidewall is desirably set smaller than the boron concentration C1 of the second conductivity type impurity region 301 so as to prevent the decrease in volume of the first conductivity type photoelectric conversion region 102. From the description up to this point, the boron concentrations of C1 and C2 desirably hold the relation of C1>C2. Desirably, the concentration of C1 is at least two times, moreover at least 10 times larger than the boron concentration of C2. Further, the depth D1 (prescribed depth) from the light receptive surface 200 to the bottom surface of the second conductivity type impurity region 301 is desirably smaller than the depth from the light receptive surface 200 to the upper surface of the first conductivity type photoelectric conversion region 102. The depth D1 may be smaller than the thickness of the semiconductor substrate 100, namely, the length half the distance between the first surface 200 and the second surface. Further, the depth D1 may be smaller than the distance E1 from the first surface 200 to the photoelectric conversion region 102. When a third surface of a virtual plane is assumed at an equidistant position from the first surface 200 and the second surface, the arrangement of each region can also be said as follows. The first region (301) is situated between the first surface 200 and the third surface. The second region (302) is situated between the second surface and the third surface. Further, the second region (302) may be situated between the first surface and the third surface.

The second conductivity type impurity regions 301 and 302 are formed by plasma doping or a solid phase diffusion method. For this reason, the boron concentration falls within the range of $1.0 \times 10^{20}$ to $1.0 \times 10^{23}$ [atms/cm$^3$] as described above. The boron concentration C3 in the depth region of D2-A' deeper than the trench bottom D2 is formed by an ion implantation method, and hence, generally falls within the range of $1.0 \times 10^{16}$ to $1.0 \times 10^{20}$ [atms/cm$^3$]. In the entire region of the depth region of A-A' of the trench 201 sidewall, boron may be implanted with an ion implantation method. As described previously, the boron concentration with the ion implantation method falls within the range of $1.0 \times 10^{16}$ to $1.0 \times 10^{20}$ [atms/cm$^3$]. In order to set the peak concentrations C1 and C2 of boron in the second conductivity type impurity region 301 or 302 at $1.0 \times 10^{20}$ to $1.0 \times 10^{23}$ [atms/cm$^3$], it is necessary to control the concentration of boron doped by plasma doping or a solid phase diffusion method.

In this manner, in accordance with the present embodiment, by forming the boron concentration profile of the trench sidewall as in FIG. 2B, it is possible to reduce the dark current around the trench. Incidentally, the boron concentration profile in the horizontal direction in parallel with the first main surface 200 monotonously increases from the impurity region 302 toward the impurity region 301. As a result, it is possible to reduce the dark current around the trench.

Referring to FIGS. 3A to 3K, a description will be given to a method for manufacturing a solid-state image pickup apparatus in accordance with the present embodiment.

Figure 3A:
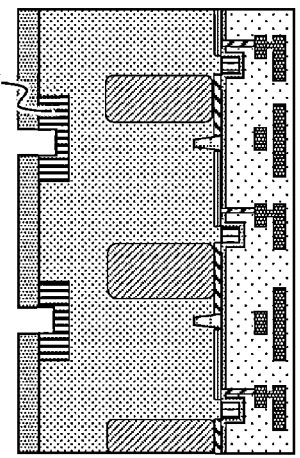
FIGS. 3A to 3K are each an explanatory view of a method for manufacturing a solid-state image pickup apparatus in accordance with First Embodiment.

FIG. 3A is a view showing a configuration after performing steps up to substrate bonding herein described. First, at the semiconductor substrate 100, the element isolation region 101 is formed by a STI method or a LOCOS method, and the first conductivity type (N type) photoelectric conversion region 102 is formed by photolithography and ion implantation. Then, after depositing the silicon oxide film formed by a thermal oxidation method and a polycrystal silicon film formed by a chemical vapor deposition (CVD) method, using photolithography and dry etching, the polycrystal silicon is patterned, thereby forming the gate electrode 105. Then, the second conductivity type (P type) impurity region 103, and the impurity region of the first conductivity type (N type) impurity region of the floating diffusion part 104 for allowing the photoelectric conversion region to have an embedded structure are formed. Then, the insulation film 106 including a silicon nitride film is formed by a CVD method so as to cover the gate electrode 105, and with a known manufacturing method, the interlayer insulation film 107, the contact hole 108 including a tungsten film embedded therein, and the wiring layer 109 including aluminum or copper are formed. Then, using known substrate bonding technique and substrate thinning technique, the semiconductor substrate is thinned to the thickness preferable as the optical characteristic of an individual image pickup apparatus. At this step, the thickness of the semiconductor substrate 100 is preferably 2 μm to 4 μm.

Figure 3B:
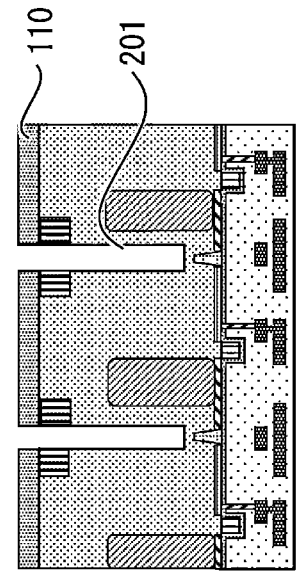

FIG. 3B shows an insulation film forming step. As shown in FIG. 3B, an insulation film 110 is formed on the light receptive surface 200 of the semiconductor substrate 100 by a plasma CVD method. The insulation film 110 is, for example, a silicon oxide film or a silicon nitride film.

Figure 3C:
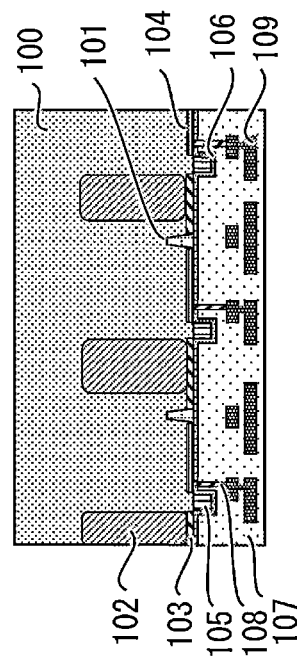

FIG. 3C shows a first etching step. As shown in FIG. 3C, a resist 111 is applied on the insulation film 110, and using photolithography and dry etching, a trench 201 is formed at the light receptive surface (first surface) 200 of the semiconductor substrate 100. After trench formation, the resist is removed. At this step, the depth of the trench 201 is desirably smaller than the distance E1 from the light receptive surface (first surface) 200 to the photoelectric conversion region 102.

Figure 3D:
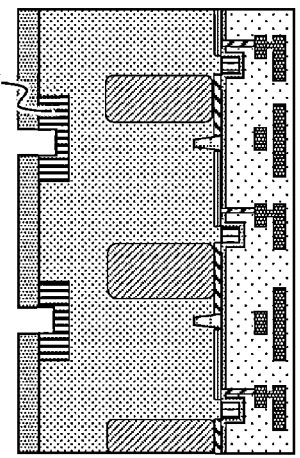

FIG. 3D shows a first impurity implanting step. As shown in FIG. 3D, by plasma doping or a solid phase diffusion method, boron is implanted into Si inside at the sidewall and the bottom surface of the trench 201, thereby forming a second conductivity type (P type) impurity region 301. The concentration of boron to be doped at this step is $1.0 \times 10^{20}$ to $1.0 \times 10^{23}$ [atms/cm$^3$]. The concentration of boron to be doped at this step may be at least $1.0 \times 10^{21}$ [atms/cm$^3$], and may be not more than $1.0 \times 10^{22}$ [atms/cm$^3$]. After boron implantation, the doped boron is desirably activated by a heat treatment or laser annealing.

Figure 3E:
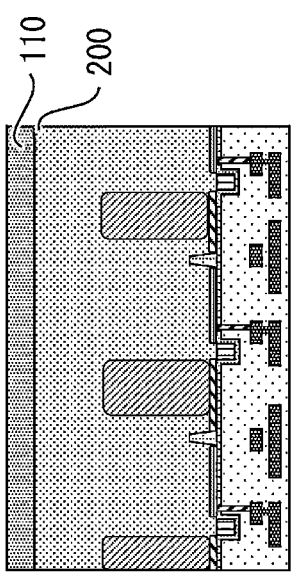

FIG. 3E shows a second etching step. As shown in FIG. 3E, using the insulation film 110 as a hard mask, dry etching is performed, thereby deepening the depth of the trench 201. The depth of the trench 201 is preferably the depth enough to allow separation of color mixture between adjacent pixels. In the present embodiment, the depth of the trench 201 is desirably 1 μm to 3 μm.

Figure 3F:
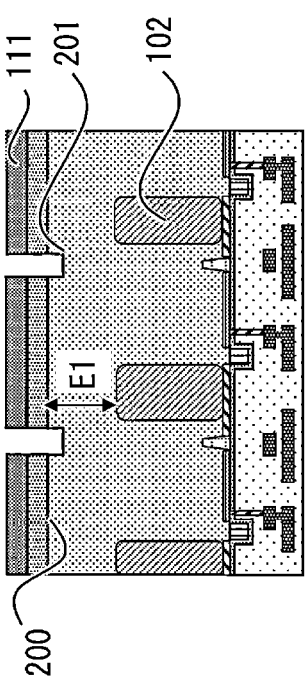

FIG. 3F shows an insulation film removing step. As shown in FIG. 3F, the insulation film 110 is removed by wet etching or dry etching. In order to reduce the damage upon etching the insulation film 110, removal is desirably performed by wet etching.

Figure 3J:
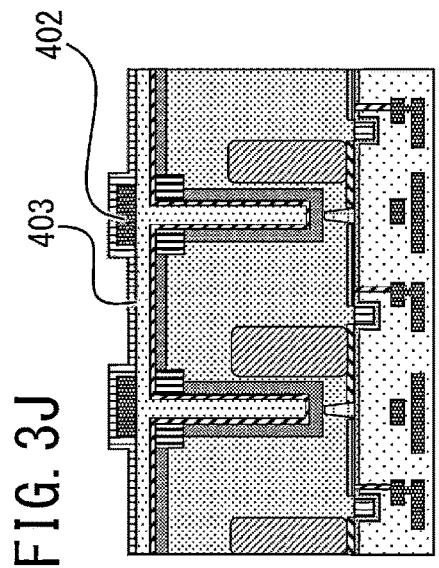
Figure 3K:
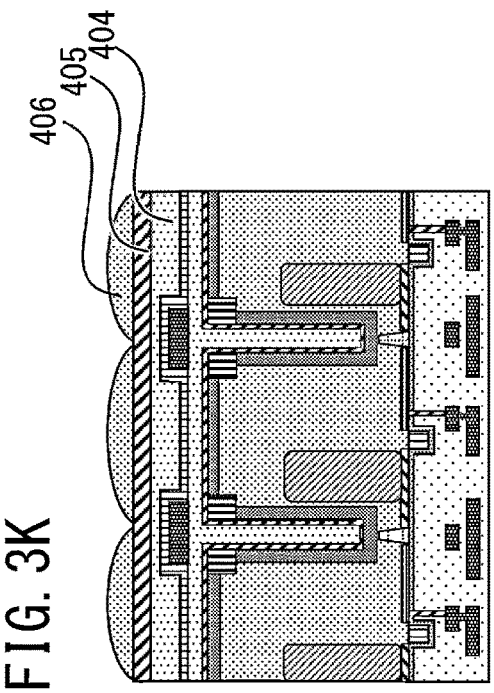
Figure 3G:
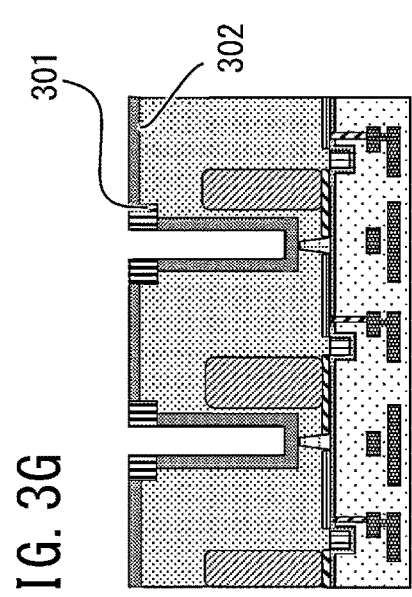

FIG. 3G shows a second impurity implanting step. As shown in FIG. 3G, boron is doped into Si inside at the sidewall and the bottom surface of the trench 201 by plasma doping or a solid phase diffusion method, thereby forming a second conductivity type (P type) impurity region 302. The concentration (second concentration) of boron to be doped at this step is $1.0 \times 10^{20}$ to $1.0 \times 10^{23}$ [atms/cm$^3$], but is required to be set lower than the boron concentration (first concentration) at the first impurity implanting step in order to implement the boron concentration profile of FIG. 2B. The concentration of boron to be doped for forming the second conductivity type (P type) impurity region 302 is lower than the concentration of boron doped for forming the second conductivity type (P type) impurity region 301. After boron doping, the doped boron is desirably activated by a heat treatment or laser annealing.

Figure 3H:
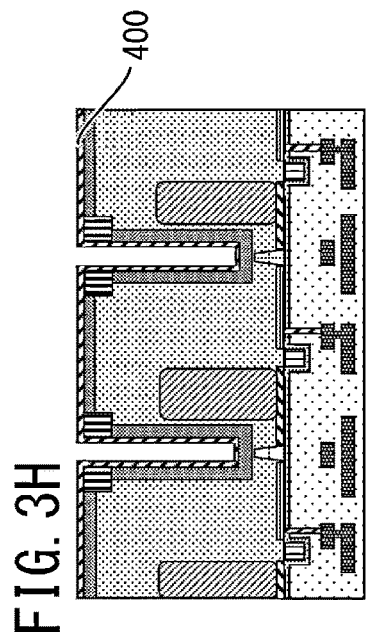

FIG. 3H shows a metal compound film forming step. As shown in FIG. 3H, a metal compound film 400 is formed by an atomic layer deposition (ALD) method and a CVD method. The metal compound film is, for example, a lamination film of aluminum oxide ($Al_2O_3$) and tantalum oxide ($Ta_2O_5$) having a negative fixed electric charge.

Figure 3I:
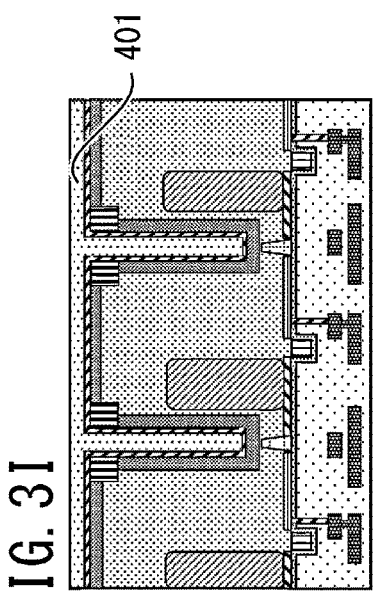

FIG. 3I shows a silicon oxide film forming step. As shown in FIG. 3I, the silicon oxide film 401 is formed by an ALD method or a CVD method.

As shown in FIG. 3J, the metal film 402 is formed by a sputtering method. Subsequently, the passivation film 403 is formed by a CVD method.

As shown in FIG. 3K, the planarizing film 404, the color filter layer 405, and the microlens 406 are formed.

By the steps up to this point, the solid-state image pickup apparatus (photoelectric conversion apparatus) can be manufactured.

Second Embodiment

Figure 4:
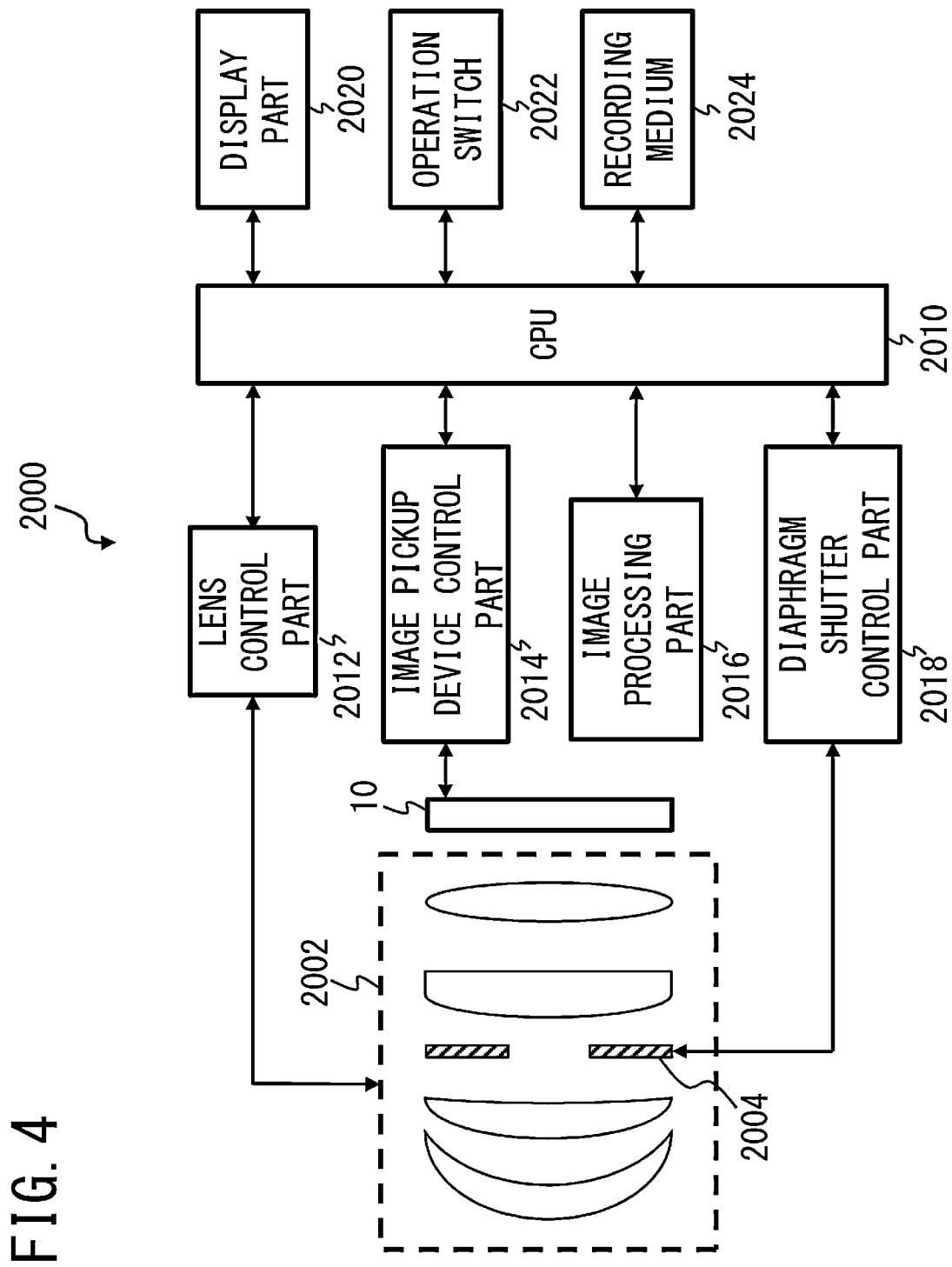
FIG. 4 is a block view of an imaging system in accordance with Second Embodiment.

An imaging system in accordance with Embodiment 2 of the present invention will be described by reference to FIG. 4. FIG. 4 is a block view showing a schematic configuration of an imaging system in accordance with the present Embodiment.

The solid-state image pickup element (photoelectric conversion apparatus) described in Embodiment 1 is applicable to various imaging systems. The applicable imaging system has no particular restriction, and examples thereof may include various devices such as a digital still camera, a digital camcorder, a surveillance camera, a copier, a fax, a portable phone, an onboard camera, an observation satellite, and a medical camera. Further, a camera module including an optical system such as a lens and a solid-state image pickup element (photoelectric conversion apparatus) is also included in the imaging system. FIG. 4 shows a block view of a digital still camera as one example thereof.

An imaging system 2000 includes, as shown in FIG. 4, an image pickup apparatus 10, an image pickup optical system 2002, a central processing unit (CPU) 2010, a lens control part 2012, an image pickup apparatus control part 2014, an image processing part 2016, and a diaphragm shutter control part 2018. The imaging system 2000 further includes a display part 2020, an operation switch 2022, and a recording medium 2024.

The image pickup optical system 2002 is an optical system for forming an optical image of a subject, and includes a lens group, a 2004, and the like. The diaphragm 2004 has a function of performing light amount adjustment by adjusting the aperture diameter, and additionally, also has a function as an exposure time adjusting shutter during photographing a still picture. The lens group and the diaphragm 2004 are held to be able to advance and retreat along the optical axis, and the linked operation thereof implements the scaling function (zooming function) and the focus adjusting function. The image pickup optical system 2002 may be integrated with the imaging system, or may be an image pickup lens mountable on the imaging system.

The image pickup apparatus 10 is positioned so that the image pickup surface is situated in the image space of the image pickup optical system 2002. The image pickup apparatus 10 is the solid-state image pickup element (photoelectric conversion apparatus) described in Embodiment 1, and includes a complementary metal oxide semiconductor (CMOS) sensor (pixel part) and the peripheral circuit (peripheral circuit region) thereof. For the image pickup apparatus 10, pixels having a plurality of photoelectric converting parts are positioned two dimensionally, and color filters are positioned with respect to the pixels, thereby forming a two dimensional single plate color sensor. The image pickup apparatus 10 photoelectrically converts the subject image formed by the image pickup optical system 2002, and outputs it as an image signal or a focus detection signal.

The lens control part 2012 is for controlling the advancing/retreating driving of the lens group of the image pickup optical system 2002, and performing a scaling operation and focus adjustment, and includes a circuit and a processing device configured so as to implement the functions. The diaphragm shutter control part 2018 is for changing the aperture diameter of the diaphragm 2004 (with the diaphragm value as variable), and adjusting the photographing light amount, and includes a circuit and a processing device configured so as to implement the functions.

The CPU 2010 is a control device in a camera for governing various controls of the camera main body, and includes an operation part, a read-only memory (ROM), a random-access memory (RAM), an analog-to-digital (A/D) converter, a digital-to-analog (D/A) converter, a communication interface circuit, and the like. The CPU 2010 controls the operation of each part in the camera according to the computer program stored in the ROM or the like, and executes a series of photographing operations such as AF, image pickup, image processing, and recording including the detection of the focus state (focus detection) of the image pickup optical system 2002. The CPU 2010 is also a signal processing part.

The image pickup apparatus control part 2014 is for controlling the operation of the image pickup apparatus 10, and A/D converting the signal outputted from the image pickup apparatus 10, and sending it to the CPU 2010, and includes a circuit and a control device configured so as to implement the functions. It does not matter if the A/D converting function is possessed by the image pickup apparatus 10. The image processing part 2016 is a processing device for performing image processing such as y conversion or color interpolation on the A/D-converted signal, and generating an image signal, and includes a circuit and a control device configured so as to implement the functions. The display part 2020 is a display device such as a liquid crystal display device (LCD), and displays the information on the photographing mode of a camera, a preview image before photographing, a confirming image after photographing, the focused state upon focus detection, and the like. The operation switch 2022 includes a power supply switch, a release (shooting trigger) switch, a zooming operation switch, a shooting mode selecting switch, and the like. The recording medium 2024 is for recording the photographed image or the like, and may be the one included in the imaging system, or may be the detachable one such as a memory card.

The imaging system 2000 to which the solid-state image pickup element in accordance with Embodiment 1 is applied is configured in this manner. As a result, a high performance imaging system can be implemented.

Third Embodiment

Figure 5A:
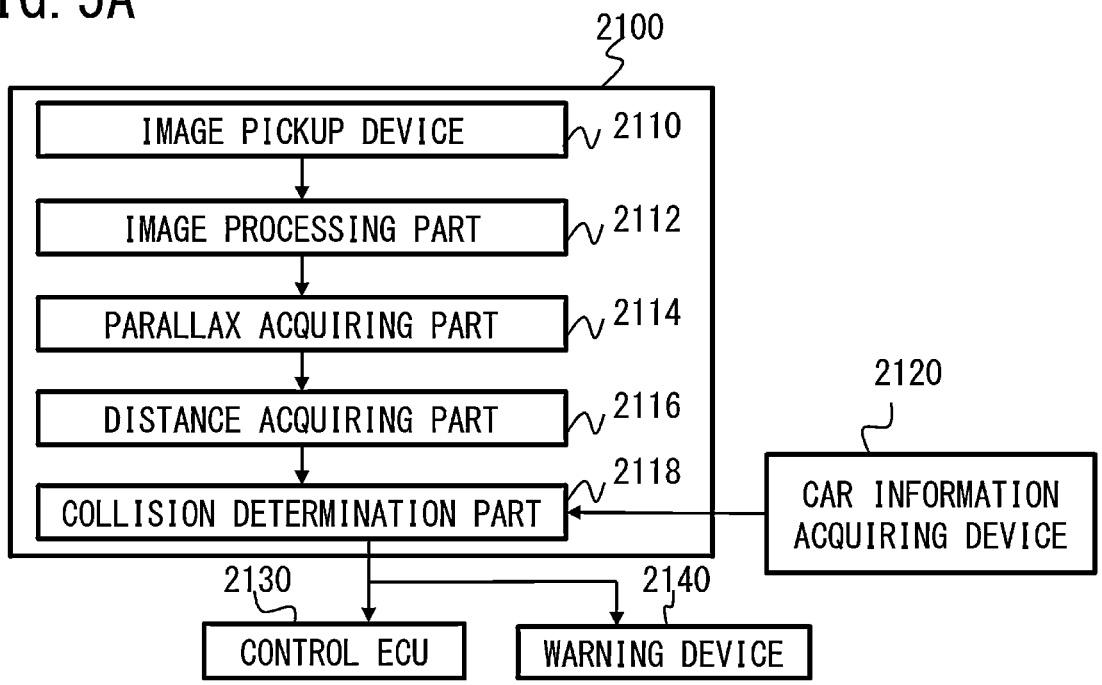
FIGS. 5A and 5B are each a block view of an imaging system and a mobile unit in accordance with Third Embodiment.
Figure 5B:
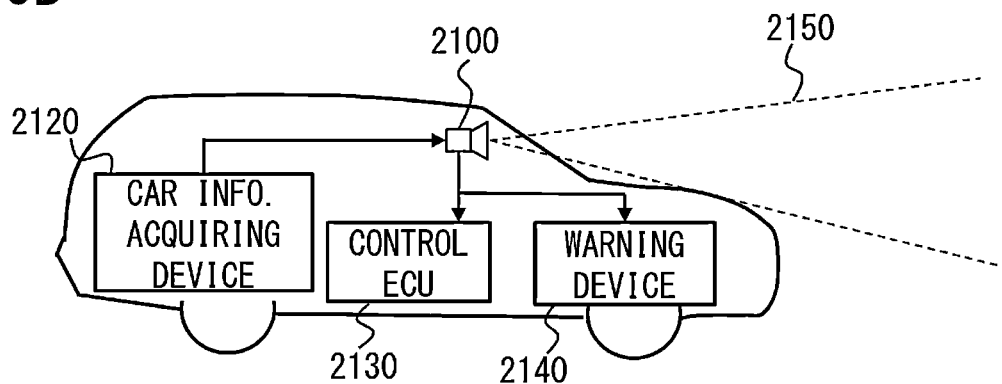

An imaging system and a mobile unit in accordance with Embodiment 3 of the present invention will be described by reference to FIGS. 5A and 5B. FIGS. 5A and 5B are views showing the configuration of the imaging system and the mobile unit in accordance with the present Embodiment.

FIG. 5A shows one example of an imaging system 2100 regarding an onboard camera. The imaging system 2100 has an image pickup apparatus 2110. The image pickup apparatus 2110 is any of the solid-state image pickup elements (photoelectric conversion apparatus) described in Embodiment 1. The imaging system 2100 has an image processing part 2112 and a parallax acquiring part 2114. The image processing part 2112 is a processing device for performing image processing on a plurality of image data acquired by the image pickup apparatus 2110. The parallax acquiring part 2114 is a processing device for performing calculation of the parallax (phase contrast between parallax images) from the plurality of image data acquired by the image pickup apparatus 2110. Further, the imaging system 2100 has a distance acquiring part 2116 which is a processing device for calculating the distance to the object based on the calculated parallax, and a collision determination part 2118 which is a processing device for determining whether there is a collision possibility or not based on the calculated distance. Herein, the parallax acquiring part 2114 or the distance acquiring part 2116 is one example of the information acquiring means for acquiring the information such as the distance information to the object. Namely, the distance information is the information regarding the parallax, the defocus amount, the distance to the object, or the like. A collision determination part 2118 may determine the collision possibility using any of the distance information. The processing devices may be implemented by an exclusively designed hardware, or may be implemented by a general-purpose hardware for performing operation based on a software module. Further, the processing device may be implemented by a FPGA (Field Programmable Gate Array), an ASIC (Application Specific Integrated Circuit), or the like, or may be implemented by the combination thereof.

The imaging system 2100 is connected to a car information acquiring device 2120, and can acquire car information such as the car speed, the yaw rate, or the steering angle. Further, to the imaging system 2100, a control engine control unit (ECU) 2130 which is a control device for outputting a control signal for causing a car to generate a braking power based on the determination result of the collision determination part 2118. Namely, the control ECU 2130 is one example of the mobile unit control means for controlling the mobile unit based on the distance information. Further, the imaging system 2100 is also connected to a warning device 2140 for issuing a warning to a driver based on the determination results at the collision determination part 2118. For example, when the collision possibility is high as the determination result of the collision determination part 2118, the control ECU 2130 performs car control of applying brakes, releasing the accelerator, suppressing the engine output, or the like, thereby avoiding collision, and reducing the damage. The warning device 2140 sounds a warning such as a sound, displays warning information on a screen of a car navigation system, or the like, applies a vibration to a seat belt or a steering, and performs other operations, thereby giving a warning to a user.

In the present Embodiment, the periphery, for example, the front or the rear of the car is imaged by the imaging system 2100. FIG. 5B shows the imaging system 2100 when the car front (imaging region 2150) is imaged. The car information acquiring device 2120 sends instructions so as to operate the imaging system 2100 to execute image pickup. By using the solid-state image pickup element of Embodiment 1 as the image pickup apparatus 2110, the imaging system 2100 of the present Embodiment can be more improved in precision of the distance measurement.

In the description up to this point, a description has been given to the example in which control is performed so as to prevent the collision with other cars. However, the present invention is applicable to the control of performing autonomous driving following another car, control of performing autonomous driving so as not to depart from the lane, and the like. Further, the imaging system is applicable to a mobile unit (transportation equipment) such as a ship, an aircraft, or an industrial robot not limited to a car such as an automobile. Mobile devices in the mobile unit (transportation equipment) are various driving sources such as an engine, a motor, a wheel, and a propeller. In addition, the present invention is applicable to, not limited to the mobile units, devices widely using object recognition such as the intelligent transport system (ITS).

In accordance with the present invention, it is possible to suppress dark current in a photoelectric conversion apparatus.

Other Embodiments

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

What is claimed is:

1. A photoelectric conversion apparatus, comprising:
   a semiconductor substrate having a first surface and a second surface opposite to the first surface;
   a plurality of photoelectric conversion regions including an impurity of a first conductivity type and arranged at the semiconductor substrate;
   a trench arranged between the plurality of photoelectric conversion regions;
   a first impurity region including an impurity of a second conductivity type opposite to the first conductivity type and arranged along the first surface and a sidewall of the trench;
   a second impurity region including the impurity of the second conductivity type and arranged along the first surface, the sidewall of the trench, and a bottom of the trench; and
   a first film arranged at the first surface and the sidewall of the trench,
   wherein a first impurity concentration of the impurity of the second conductivity type in the first impurity region is higher than a second impurity concentration of the impurity of the second conductivity type in the second impurity region and a maximum distance between the first surface and the first impurity region is smaller than a maximum distance between the first surface and a part of the second impurity region arranged along the sidewall of the trench,
   wherein the maximum distance between the first surface and the first impurity region is larger than a distance between the first surface and another part of the second impurity region arranged along the first surface, and
   wherein a maximum distance between the sidewall of the trench and an outer sidewall of the first impurity region is larger than a maximum distance between the sidewall of the trench and an outer sidewall of the part of the second impurity region.

2. The photoelectric conversion apparatus according to claim 1, wherein the first impurity concentration in the first impurity region along the sidewall of the trench and the second impurity concentration in the part of the second impurity region along the sidewall of the trench monotonously decrease with an increasing depth of the trench from the first surface.

3. The photoelectric conversion apparatus according to claim 1, wherein the first impurity concentration is at least two times the second impurity concentration.

4. The photoelectric conversion apparatus according to claim 1, wherein the first impurity concentration in the first impurity region along the sidewall of the trench and the second impurity concentration in the part of the second impurity region along the sidewall of the trench are within a range of $1.0\times10^{20}$ to $1.0\times10^{23}$ atms/cm$^3$.

5. The photoelectric conversion apparatus according to claim 1, wherein a depth from the first surface to the first impurity region is smaller than a depth from the first surface to the plurality of photoelectric conversion regions.

6. The photoelectric conversion apparatus according to claim 1, wherein the impurity of each of the first impurity region and the second impurity region is boron.

7. The photoelectric conversion apparatus according to claim 1, wherein the first film is a lamination film of aluminum oxide and tantalum oxide.

8. The photoelectric conversion apparatus according to claim 1, wherein the part of the second impurity region is located at a length of half a thickness of the semiconductor substrate from the first surface in a depth direction.

9. The photoelectric conversion apparatus according to claim 1, wherein a width of the first impurity region is wider than a width of the second impurity region.

10. The photoelectric conversion apparatus according to claim 1, wherein an impurity concentration of an impurity of the second conductivity type in the semiconductor substrate is lower than the second impurity concentration.

11. An apparatus, comprising:
a photoelectric conversion apparatus, comprising:
- a semiconductor substrate having a first surface and a second surface opposite to the first surface;
- a plurality of photoelectric conversion regions including an impurity of a first conductivity type and arranged at the semiconductor substrate;
- a trench arranged between the plurality of photoelectric conversion regions;
- a first impurity region including an impurity of a second conductivity type opposite to the first conductivity type and arranged along the first surface and a sidewall of the trench;
- a second impurity region including the impurity of the second conductivity type and arranged along the first surface, the sidewall of the trench, and a bottom of the trench; and
- a first film arranged at the first surface and the sidewall of the trench,
wherein a first impurity concentration of the impurity of the second conductivity type in the first impurity region is higher than a second impurity concentration of the impurity of the second conductivity type in the second impurity region and a maximum distance between the first surface and the first impurity region is smaller than a maximum distance between the first surface and a part of the second impurity region arranged along the sidewall of the trench; and
a signal processing part for processing a signal output from the photoelectric conversion apparatus,
wherein the maximum distance between the first surface and the first impurity region is greater than a distance between the first surface and another part of the second impurity region arranged along the first surface, and
wherein a maximum distance between the sidewall of the trench and an outer sidewall of the first impurity region is greater than a maximum distance between the sidewall of the trench and an outer sidewall of the part of the second impurity region.

12. An apparatus, comprising:
a photoelectric conversion apparatus, comprising:
- a semiconductor substrate having a first surface and a second surface opposite to the first surface;
- a plurality of photoelectric conversion regions including an impurity of a first conductivity type and arranged at the semiconductor substrate;
- a trench arranged between the plurality of photoelectric conversion regions;
- a first impurity region including an impurity of a second conductivity type opposite to the first conductivity type and arranged along the first surface and a sidewall of the trench;
- a second impurity region including the impurity of the second conductivity type and arranged along the first surface, the sidewall of the trench, and a bottom of the trench; and
- a first film arranged at the first surface and the sidewall of the trench,
wherein a first impurity concentration of the impurity of the second conductivity type in the first impurity region is higher than a second impurity concentration of the impurity of the second conductivity type in the second impurity region and a maximum distance between the first surface and the first impurity region is smaller than a maximum distance between the first surface and a part of the second impurity region arranged along the sidewall of the trench;
a mobile device;
a processing device for acquiring information from a signal output from the photoelectric conversion apparatus; and
a control device for controlling the mobile device on the basis of the information,
wherein the maximum distance between the first surface and the first impurity region is larger than a distance between the first surface and another part of the second impurity region arranged along the first surface, and
wherein a maximum distance between the sidewall of the trench and an outer sidewall of the first impurity region is larger than a maximum distance between the sidewall of the trench and an outer sidewall of the part of the second impurity region.

* * * * *